United States Patent [19]
Tateyama

[11] Patent Number: 5,943,880
[45] Date of Patent: Aug. 31, 1999

[54] COOLING APPARATUS, COOLING METHOD, AND PROCESSING APPARATUS

[75] Inventor: Kiyohisa Tateyama, Kumamoto, Japan

[73] Assignee: Tokyo Electron Limited, Tokyo, Japan

[21] Appl. No.: 09/023,211

[22] Filed: Feb. 13, 1998

[30] Foreign Application Priority Data

Feb. 14, 1997 [JP] Japan ..................................... 9-044867

[51] Int. Cl.[6] .................................................. F25D 17/02
[52] U.S. Cl. ................................ 62/434; 62/314; 62/48.1; 62/52.1; 62/304; 34/75; 34/76; 34/77; 34/78; 34/517; 34/518; 34/516
[58] Field of Search ........................... 62/314, 48.1, 52.1, 62/304, 309, 434; 34/75, 76, 77, 78, 516, 517, 518

[56] References Cited

U.S. PATENT DOCUMENTS

| | | | |
|---|---|---|---|
| 4,597,736 | 7/1986 | Moffat | 432/26 |
| 4,667,478 | 5/1987 | Jones, III | 62/64 |
| 4,878,353 | 11/1989 | Gibot et al. | 62/52.1 |
| 4,934,151 | 6/1990 | Shima | 62/64 |
| 5,315,834 | 5/1994 | Garunts et al. | 62/78 |
| 5,551,165 | 9/1996 | Turner et al. | 34/404 |

*Primary Examiner*—Henry Bennett
*Assistant Examiner*—M. Shulman
*Attorney, Agent, or Firm*—Foley & Lardner

[57] ABSTRACT

A refrigerant is directly contacted to a substrate to be processed that was heated so as to quickly cool the substrate. Thus, the temperature of the substrate is dropped to a predetermined temperature level. The substrate is cooled by a cooling device and cooling water. Thus, the cooling temperature can be accurately controlled. In addition, the substrate can be effectively cooled.

20 Claims, 5 Drawing Sheets

COOLING APPARATUS, COOLING METHOD, AND PROCESSING APPARATUS

BACKGROUND OF THE INVENTION

1. Field of the Invention

The present invention relates to a cooling method for cooling substrates to be processed such as LCD substrates and silicon substrates, a cooling apparatus thereof, and a processing apparatus therewith.

2. Description of the Related Art

When a semiconductor device or a liquid display (LCD) is fabricated, a photo-resist solution is coated on a semiconductor wafer as a substrate or an LCD substrate. Thus, a resist film is formed. Thereafter, the resist film is exposed corresponding to a circuit pattern. The resultant resist film is developed. In other words, a circuit pattern is formed by so-called photo-lithography technology.

In such coating and developing processes, to stably form a resist film, heat processes such as a pre-baking process, a post-exposure baking process, and a post-baking process are performed. In addition, a cooling process for cooling such a heated substrate is performed.

When a heated substrate is cooled, the heat is exchanged on a cooling plate that supports the substrate. In reality, a heated substrate is disposed on a cooling plate with a cold water circulating pipe. Heat is exchanged between the cooling water and the substrate and thereby the temperature of the substrate is lowered.

However, in the conventional substrate cooling method, to shorten the time, the substrate should be effectively cooled. To do that, the substrate should directly contact the entire surface of the cooling plate. In this case, after the substrate is cooled, when it is dismounted from the cooling plate, static electricity occurs. Thus, the substrate is charged.

In addition, in the heat exchange method with the cooling plate, the response characteristic against the temperature adjustment deteriorates and becomes inaccurate.

SUMMARY OF THE INVENTION

An object of the present invention is to provide a cooling method for effectively cooling substrates to be processed, a cooling apparatus thereof, and a processing apparatus therewith.

Another object of the present invention is to provide a cooling method for cooling substrates to be processed at an accurate temperature, a cooling apparatus thereof, and a processing apparatus therewith.

A further object of the present invention is to provide a cooling method for preventing a dielectric breakdown of substrates to be processed, a cooling apparatus thereof, and a processing apparatus therewith.

A first aspect of the present invention is a cooling apparatus for cooling a substrate to be processed, comprising a supporting member for supporting the substrate, a cooling means for cooling the supporting member, and a refrigerant supplying means for supplying a refrigerant to the substrate supported by the supporting member.

A second aspect of the present invention is a cooling apparatus for cooling a substrate to be processed, comprising a supporting member for supporting the substrate, a cooling device disposed in the supporting member, and a cooling water pipe for circulating cooling water in the supporting member.

A third aspect of the present invention is a processing apparatus for supplying a liquid to a substrate to be processed and performing a predetermined process for the substrate, comprising a heat processing portion for raising the temperature of the substrate, and a cooling portion for cooling the heated substrate, wherein the cooling portion has a supporting portion for supporting the substrate, a cooling means for cooling the supporting member, and a refrigerant supplying means for supplying a refrigerant to the substrate supported by the supporting member.

A fourth aspect of the present invention is a processing apparatus for supplying a liquid to a substrate to be processed and performing a predetermined process for the substrate, comprising a heat processing portion for raising the temperature of the substrate, and a cooling portion for cooling the heated substrate, wherein the cooling portion has a supporting member for supporting the substrate, a cooling device disposed in the supporting member, and a cooling water pipe for circulating cooling water in the supporting member.

A fifth aspect of the present invention is a cooling method for cooling a substrate to be processed, comprising the steps of (a) quickly cooling the substrate at a first cooling velocity; and (b) cooling the substrate that was quickly cooled in the step (a) at a second cooling velocity that is slower than the first cooling velocity.

According to the present invention, after a substrate that was heated is quickly cooled at a first cooling velocity, the substrate is cooled at a second cooling velocity that is lower than the first cooling velocity. In other words, after the substrate is coarsely cooled, it is accurately cooled to a predetermined temperature. Thus, the substrate can be effectively cooled in comparison with the case that only cooling devices are used or the case that only cooling water is used. Consequently, the tact time in the cooling process can be shortened.

In addition, since the supply amount of a refrigerant that causes a substrate to be processed to be quickly cooled is controlled, the first cooling velocity in the quick cooling mode can be controlled.

Moreover, with a combination of cooling devices and a cooling water pipe, in a simple structure, a substrate can be cooled accurately and inexpensively. In other words, according to the present invention, a high cooling capability of a refrigerant and a high control accuracy of cooling devices such as Peltier devices are effectively switched and thereby a substrate can be effectively cooled.

In addition, as a cooling means for a supporting member, both cooling devices and a cooling water pipe that circulates cooling water are used. Thus, the number of cooling devices that are expensive can be decreased. Consequently, the number of driver ICs for the cooling devices can be decreased. As a result, in a simple structure, a substrate can be cooled accurately and inexpensively.

Moreover, according to the present invention, since a refrigerant supplying means is provided, a refrigerant directly contacts a substrate and thereby quickly cools it. Thus, a substrate can be effectively cooled in comparison with the case that only cooling devices are used or the case that only cooling water is used. Consequently, the tact time in the substrate cooling process can be shortened.

According to the present invention, a refrigerant supplying means contacts a refrigerant to a substrate. In addition, cooling devices and a cooling water pipe that circulates cooling water are used as a cooling means for a supporting member. Thus, in a simple structure, a substrate can be cooled accurately and inexpensively. In addition, the tact time in the substrate cooling process can be shortened.

Moreover, with a chamber that can be opened and closed for causing a substrate to be placed in a sealed atmosphere, a refrigerant can be supplied to the substrate without raising the temperature of the refrigerant. Thus, the substrate can be quickly and effectively cooled. In addition, since the chamber can be opened and closed, it does not prevent a substrate from being loaded and unloaded.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, embodiments of the present invention will be described.

Figure 1:
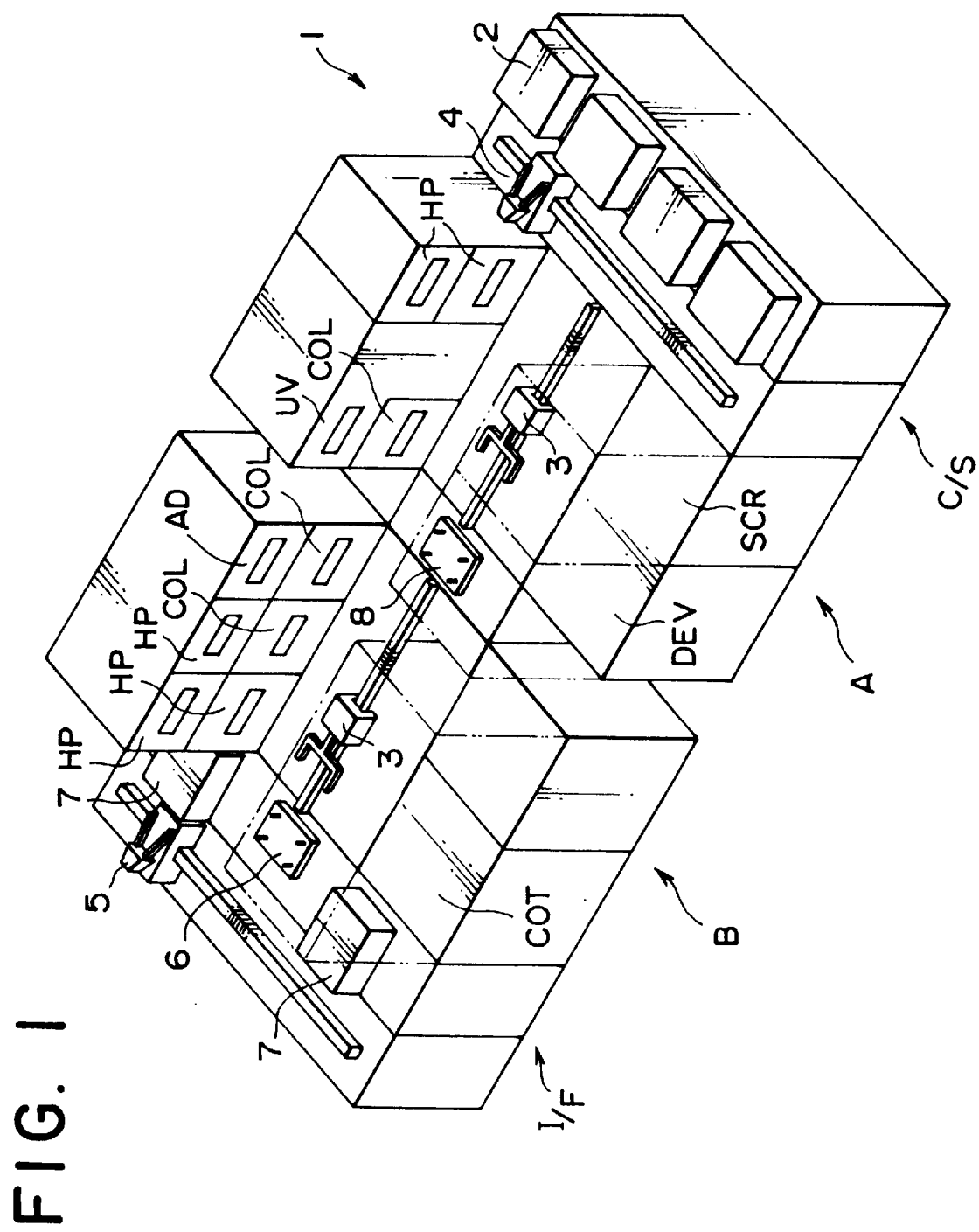
FIG. 1 is a perspective view showing a coating and developing apparatus according to an embodiment of the present invention.

FIG. 1 is a perspective view showing a coating and developing apparatus according to an embodiment of the present invention.

Figure 2:
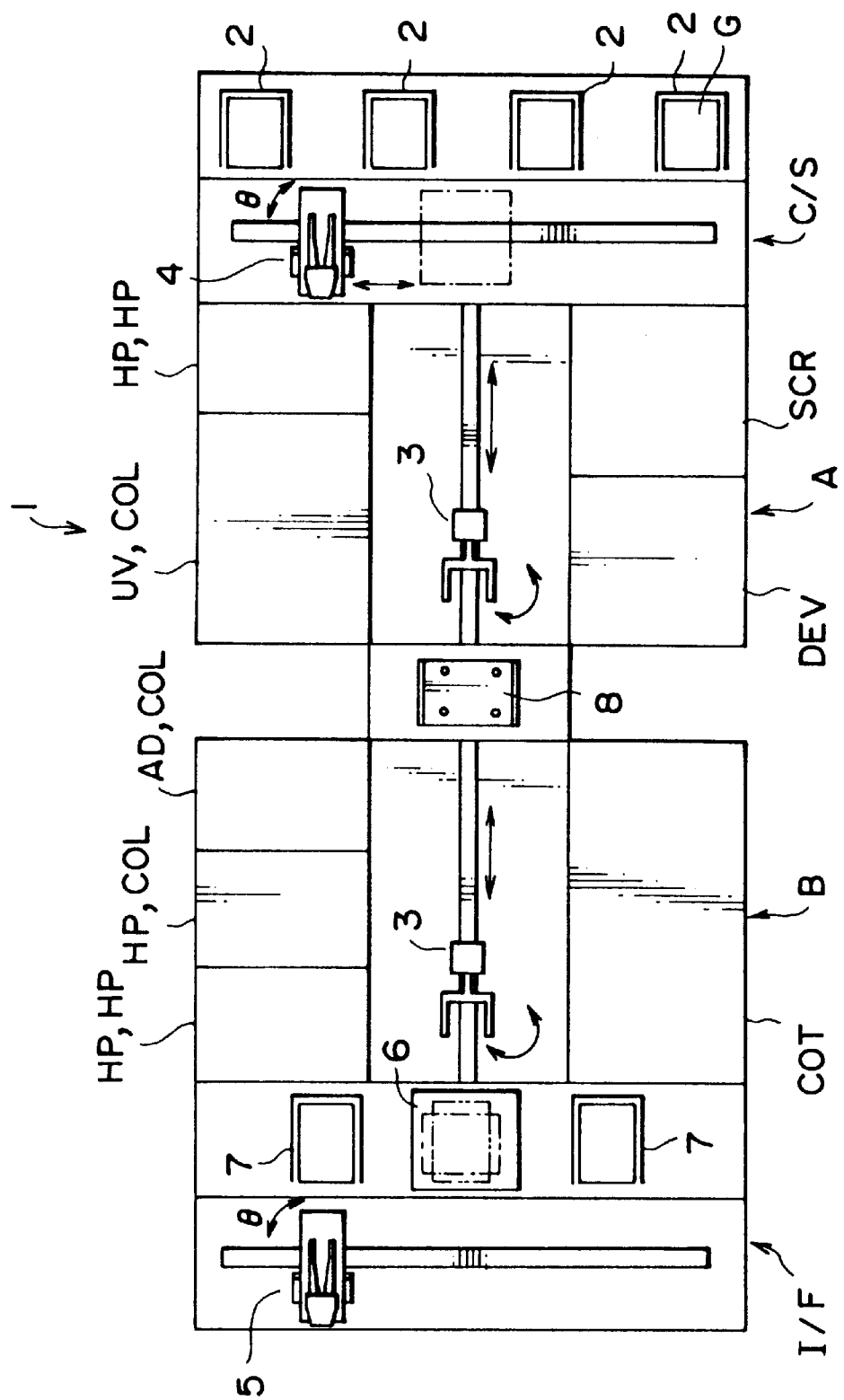
FIG. 2 is a plan view of FIG. 1.

FIG. 2 is a plan view of FIG. 1.

The coating and developing apparatus 1 has a cassette station C/S. The cassette station C/S is disposed at one edge side of the coating and developing apparatus 1. In addition, at the other edge side of the coating and developing apparatus 1, an interface unit I/F is disposed. The interface unit I/F exchanges a (glass) substrate G between an exposing unit (not shown) and the coating and developing apparatus 1.

The cassette station C/S has a plurality of cassettes 2 (for example, four cassettes 2). Each of the cassettes 2 accommodates substrates C; such as LCD substrates. At the front side of the cassettes 2 of the cassette station C/S, an auxiliary arm 4 that transfers and aligns a substrate G to be processed is disposed. In addition, the auxiliary arm 4 holds a substrate G and transfers it with a first main arm 3.

An auxiliary arm 5 is disposed at the interface unit I/F. The auxiliary arm 5 exchanges a substrate G with the exposing unit (not shown). An extension portion 6 and a buffer unit 7 are disposed at the interface unit I/F. The extension portion 6 exchanges a substrate G with the main arm 3. The buffer unit 7 temporarily holds a substrate G.

There are two main arms 3 that are the first main arm and the second main arm disposed in series so that they can move at the center portion of the coating and developing apparatus 1 in the longitudinal direction. A first processing unit block A is disposed on both sides of the first main arm 3. A second processing unit block B is disposed on both sides of the second main arm 3. A junction portion 8 is disposed between the first processing unit block A and the second processing unit block B the junction portion 8 temporarily holds a substrate G and cools it.

The first processing unit block A has a rinse processing unit SCR and a development processing unit DEV. The rinse processing unit SCR rinses a substrate G. The development processing unit DEV performs a developing process. The rinse processing unit SCR is disposed adjacent to the cassette station C/S. The development processing unit DEV is disposed adjacent to the rinse processing unit SCR. At the other side of the conveying path of the first main arm 3, two sets of heat processing units HP, an UV processing unit UV, and a cooling unit COL are disposed. The two heat processing units HP are layered. The UV processing unit UV and the cooling unit COL are layered. The two heat processing units HP that are layered are disposed adjacent to the UV processing unit UV and the cooling unit COL that are layered.

The second processing unit block B has a coating processing unit COT that performs a resist coating process and an edge removing process. At the other side of the conveying path of the second main arm 34, an adhesion unit AD, two cooling units COL, and three heat processing units HP. The adhesion unit AD and the first cooling unit COL are layered. The first heat processing unit HP and the second cooling unit COL are layered. The third and fourth heat processing units HP are layered. The adhesion unit AD and the first cooling unit COL that are layered are disposed adjacent to the first heat processing unit HP and the second cooling unit COI that are layered. The first heat processing unit HP and the second cooling unit COL that are layered are disposed adjacent to the second heat processing unit HP and the third heat processing unit HP that are layered. The first heat processing unit HP and the second cooling unit COL are layered as an upper unit and a lower unit, respectively, so as to prevent mutual heat inference. Thus, the temperature can be more accurately controlled.

Each of the first and second main arms 3 has an X axis driving mechanism, a Y axis driving mechanism, and a Z axis driving mechanism. In addition, each of the first and second main arms 3 has a rotation driving mechanism. The first and second main arm 3 travel along respective center paths of the coating and developing apparatus 1 among each processing unit. The main arms 3 load a substrate G that has not been processed to each processing unit. In addition, the main arms 3 unload a substrate G that has been processed from each processing unit.

The coating and developing apparatus 1 according to the present invention centralizes such individual processing units, thereby reducing the space and improving the efficiency of the processes.

In the coating and developing apparatus 1, a substrate G in a cassette 2 is sent to the rinse processing unit SCR through the auxiliary arm 4 and the first main arm 3. The rinse processing unit SCR rinses the substrate G.

Next, the substrate G is sent to the adhesion unit AD through the first main arm 3, the junction portion 8, and the second main arm 3. The adhesion unit AD performs a hydrophobic process for the substrate G. Thus, the fixing characteristic of the resist is improved.

Next, the substrate G is sent to the cooling unit COL through the second main arm 3. Thereafter, the substrate G is sent to the coating processing unit COT through the second main arm 3. The coating processing unit COT coats a resist to the substrate G.

Next, the substrate G is sent to the heat processing unit HP through the second main arm 3. The heat processing unit HP performs a pre-baking process for the substrate G. Thereafter, the substrate G is sent to the cooling unit COL through the second main arm 3. The cooling unit COL cools the substrate G. Next, the substrate G is sent to the exposing unit through the second main arm 3 and the interface unit I/F. The exposing unit exposes a predetermined pattern on the substrate G.

The substrate G is returned to the coating and developing apparatus 1 through the interface unit I/F. The substrate G is sent to the heat processing unit HP through the second main arm 3. The heat processing unit HP performs a post-exposure baking process for the substrate G.

Thereafter, the substrate G is sent to the heat processing unit HP through the first main arm 3, the junction portion 8, and the second main arm 3. The heat processing unit HP cools the substrate G. The substrate G is sent to the development processing unit DEV through the first main arm 3. The development processing unit DEV develops a predetermined circuit pattern on the substrate G. The resultant substrate G is sent to the UV processing unit UV through the first main arm 3. The UV processing unit UV performs an UV process for the substrate G.

The resultant substrate G is accommodated in a relevant predetermined cassette 2 on the cassette station C/S through the first main arm 3 and the auxiliary arm 4.

Figure 3:
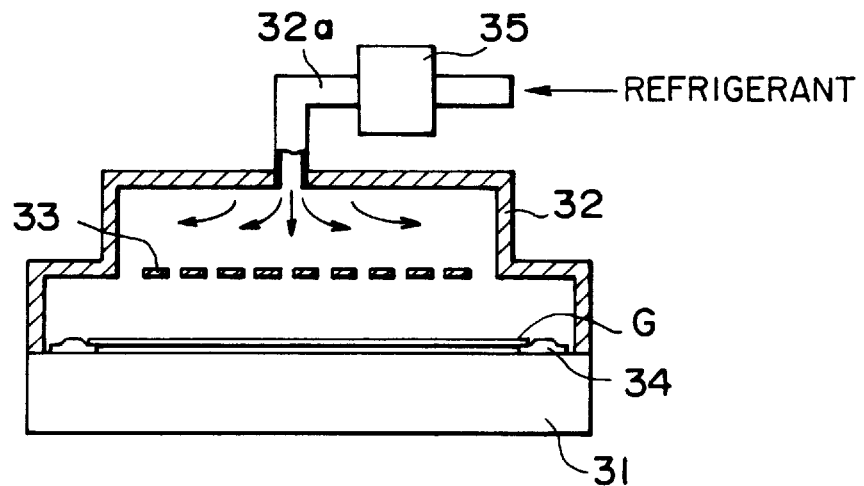
FIG. 3 is a first plan view showing a cooling unit shown in FIGS. 1 and 2.
Figure 4:
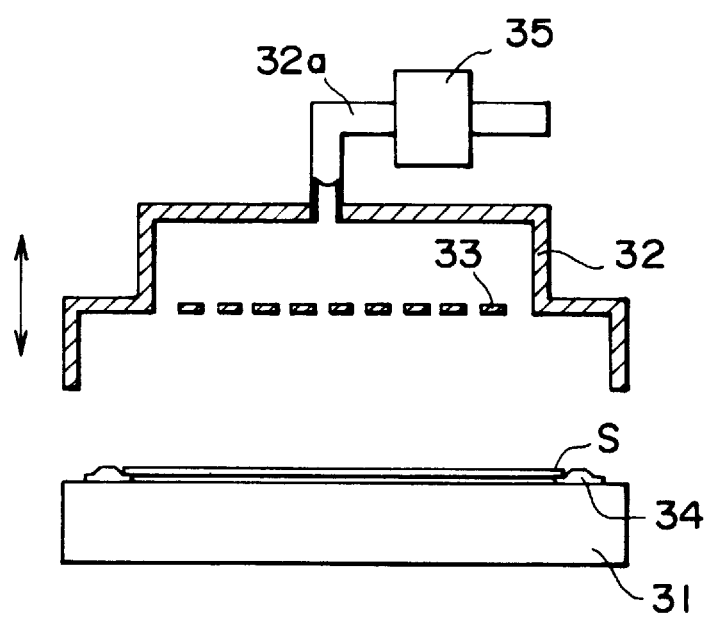
FIG. 4 is a second plan view showing a cooling unit shown in FIGS. 1 and 2.

FIGS. 3 and 4 are plan views showing the structure of the cooling unit COL of the coating and developing apparatus 1.

In FIGS. 3 and 4, reference numeral 31 is a cooling plate that is a supporting member for a substrate G. A supporting portion 34 is disposed on the cooling plate 31. The supporting portion 34 supports the peripheral portion of the substrate G in such a manner that it floats for a predetermined length. The supporting portion 34 is composed of resin, rubber, or the like. In this example, a plurality of supporting portions 34 are disposed (for example, four supporting portions 34 are disposed). These supporting portions 34 support the peripheral portion of the substrate G with side surfaces thereof. As another means for supporting the substrate G, fixed pins that support the rear surface of the substrate G. As a further means for supporting the substrate G, proximity pins may be disposed. The proximity pins pop upward support the substrate G when it is loaded to the cooling unit COL. With these supporting portions, since the entire surface of the substrate G does not contact the cooling plate 31, when the substrate G is mounted or dismounted, the substrate G is prevented from being charged with static electricity.

The cooling plate 31 is covered by a cover to form a chamber 32 so that a substrate G is placed in a sealed atmosphere. The chamber 32 can be raised and lowered by a raising/lowering means (not shown). Thus, as shown in FIGS. 3 and 4, the chamber 32 is structured so that the cooling plate 31 is opened and closed. A refrigerant supplying pipe 32a is disposed at a top portion of the chamber 32. The refrigerant supplying pipe 32a supplies a refrigerant (preferably, an inert gas (for example, liquid nitrogen, nitrogen gas, or the like) ) to the chamber 32. The refrigerant supplying pipe 32a has a flow meter 35. In addition, the chamber 32 has a diffusion plate 33. With a dry type refrigerant such as liquid nitrogen, the static electricity can be better suppressed from occurring on the surface of the substrate G.

Figure 5:
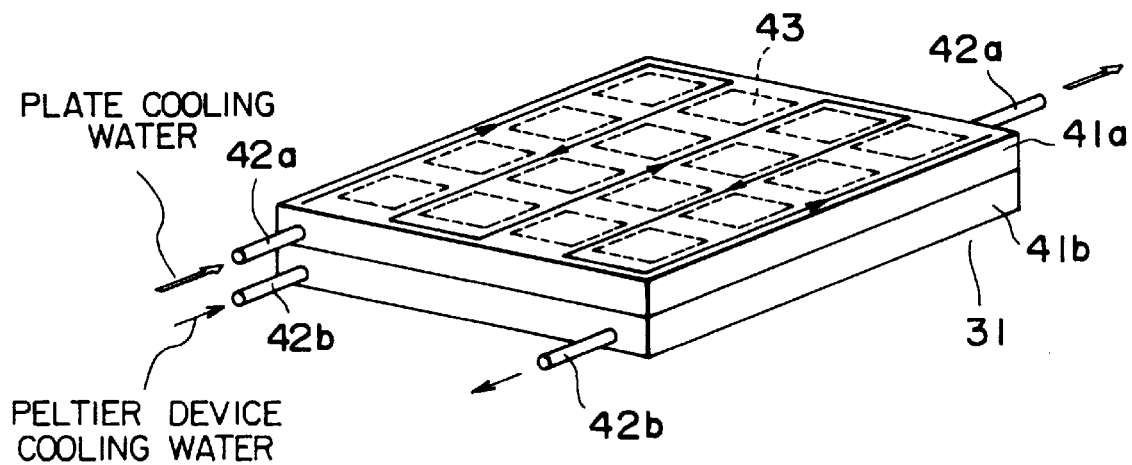
FIG. 5 is a perspective view showing a cooling plate according to another embodiment of the present invention.
Figure 6:
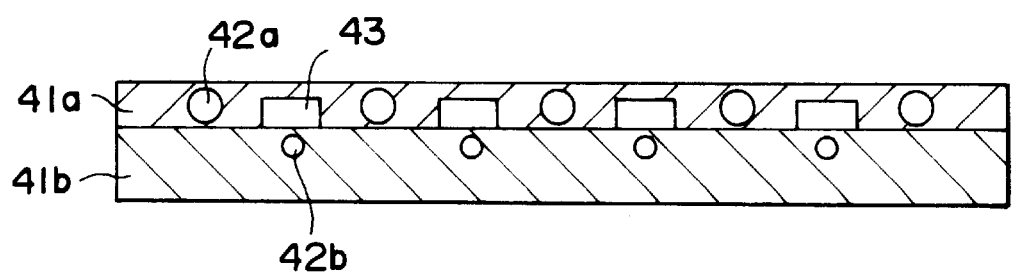
FIG. 6 is a plan view showing a cooling unit according to another embodiment of the present invention.

FIG. 5 is a perspective view showing the structure of the cooling plate 31. FIG. 6 is a sectional view of FIG. 5.

The cooling plate 31 is composed of an upper plate 41a and a lower plate 41b that are layered. The upper plate 41a has Peltier devices 43 and a cooling water pipe 42a for cooling the substrate G. The lower plate 41b has a cooling water pipe 42a for cooling the Peltier devices 43.

In FIG. 5, solid arrows represent the cooling water pipe 42a for cooling the cooling plate 31 and the substrate G. A plurality of Peltier devices 43 are regularly disposed on the upper plate 41a of the cooling plate 31.

With the Peltier devices 43 and the cooling water pipe 42a as a cooling means of the cooling plate 31, the number of cooling devices that are expensive can be decreased. Thus, the number of driver ICs for the cooling devices can be decreased. In reality, to exchange heat of for example 2000 kcal/h, 66 Peltier devices are required (assuming that the heat exchange capability of each Peltier device is 30 kcal/h). Thus, many drive ICs corresponding to such Peltier devices are required. However, in the structure shown in FIGS. 5 and 6, when heat of 2000 kcal/h is exchanged, the number of Peltier devices can be decreased to 30. Thus, the number of driver ICs for the Peltier devices can be decreased. In addition, since the Peltier devices are used, the temperature response characteristic is high and thereby a substrate can be accurately cooled.

Next, the operation of the cooling unit COL will be described.

First of all, a substrate G that was heated by heat processes such as the pre-baking process, the post-exposure baking process, and the post-baking process is loaded to the cooling unit COL. At this point, the substrate G is supported by the supporting portion 34 of the cooling plate 31 in such a manner that the substrate G floats from the cooling plate 31.

Next, as shown in FIG. 3, the chamber 32 is lowered by the raising/lowering means and thereby the substrate G is placed in a sealed atmosphere or a semi-sealed atmosphere. In the case of the semi-sealed atmosphere, a gas exhaust flow path is provided.

Next, in the case of the sealed atmosphere, the chamber 32 is gas-purged (deaerated) by an exhaust means (not shown) of the chamber 32.

Thereafter, a refrigerant is supplied to the chamber 32 through the refrigerant supplying pipe 32a . The supplied refrigerant passes through the diffusion plate 33 of the chamber 32 and thereby equally reaches the front surface of the substrate G. The cooling capability is controlled by varying the flow rate and supply time of the supply gas.

At this point, with cooling water that flows in the cooling water pipe 42a , the substrate G is acceleratingly cooled from the rear surface thereof.

Thus, since the refrigerant directly contacts the front surface of the substrate G and the cooling water cools the substrate G, the temperature thereof quickly drops.

In the above-described operation, the cooling velocity of the substrate G can be controlled with the flow meter 35.

Alternatively, the temperature of the substrate G can be controlled by adjusting the supply time of the refrigerant. In addition, since the refrigerant is supplied to the substrate G in the sealed atmosphere with the chamber 32, the refrigerant can be supplied to the substrate G without raising the temperature of the refrigerant due to the heat insulating effect. Thus, the substrate can be effectively and quickly cooled.

Next, as shown in FIG. 4, the chamber 32 is raised by the raising means and thereby the substrate G is exposed in the cooling unit COL. Thereafter, the substrate G is accurately cooled by the Peltier devices of the cooling plate 31.

Figure 7:
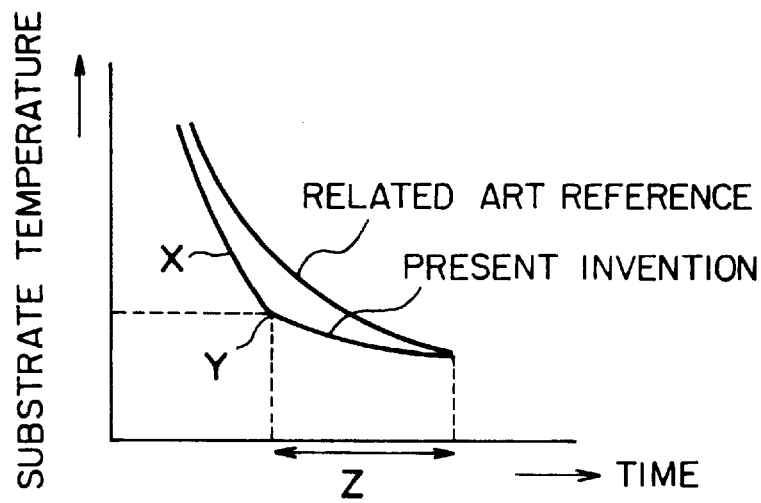
FIG. 7 is a graph showing the relation between substrate temperature and time for explaining a cooling velocity according to a substrate cooling method of the present invention.

FIG. 7. shows the relation between substrate temperature and time in the above-described substrate cooling method. In other words, in a rapid cooling mode, the temperature of the substrate G drops at a cooling velocity (first cooling velocity) represented by letter X. In a normal cooling mode, the temperature of the substrate drops at a cooling velocity (second cooling velocity) represented by letter Y.

As is clear from FIG. 7, according to the substrate cooling method of the present invention, after the temperature of the substrate is coarsely dropped in the rapid cooling mode, the temperature thereof is accurately dropped. Thus, the cooling time of the substrate G of the cooling method according to the present invention becomes shorter than that of the related art reference by Z. Consequently, the time in the substrate cooling process can be shortened.

In addition, since the substrate can be effectively cooled, it is not necessary to contact the entire surface to the cooling plate. Thus, the supporting structure shown in FIGS. 3 and 4 can be used. Consequently, when the substrate G is mounted or dismounted, it can be prevented from being charged with static electricity.

Moreover, with the cooling plate 31 shown in FIGS. 5 and 6, the heat of the substrate G is removed with refrigerant and cooling water. In addition, the temperature of the substrate is accurately adjusted by the Peltier devices. Thus, in such a simple structure, the substrate G can be cooled accurately and inexpensively.

It should be noted that the present invention is not limited to the above-described embodiment. Instead, various modifications of the present invention are available.

Figure 8:
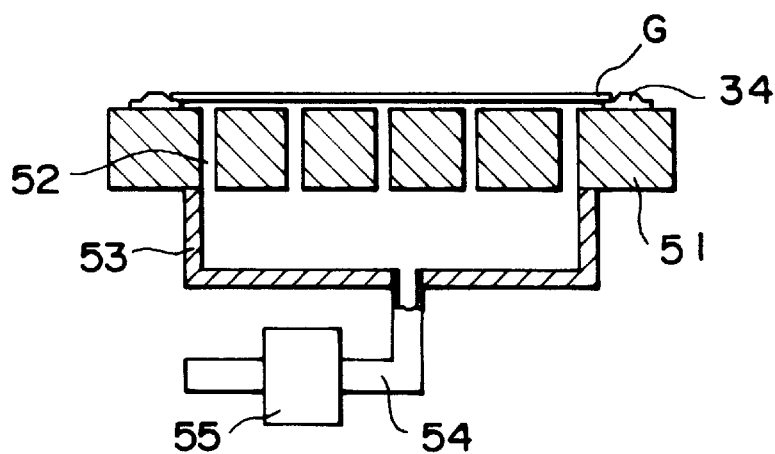
FIG. 8 is a vertical sectional view of FIG. 7.

For example, in the above-described embodiment, as shown in FIGS. 3 and 4, the refrigerant was supplied from the front surface of the substrate G. Alternatively, the refrigerant may be supplied from the rear surface of the substrate G as shown in FIG. 8. As shown in FIG. 8, a plurality of through-holes 52 are disposed in a cooling plate 51. The rear surface of the cooling plate 51 is covered by a cover to form a chamber 53. A refrigerant supplying pipe 54 that supplies a refrigerant is disposed at a bottom portion of the chamber 53. A flow meter 55 is disposed on the refrigerant supplying pipe 54. In this case, the raising/lowering mechanism and the diffusion plate of the cooling unit shown in FIGS. 3 and 4 can be omitted.

In the above-described embodiment, the substrate cooling apparatus according to the present invention was applied to a resist coating and developing apparatus. However, the present invention can be applied to another process.

Moreover, in the above-described embodiment, an LCD substrate was used. However, it should be noted that the present invention can be applied to a process for other substrates such as semiconductor wafers.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A cooling apparatus for cooling a substrate to be processed, the substrate having a first side and a second side opposite the first side, comprising:
   a supporting member for supporting the substrate from the second substrate side;
   cooling means for cooling said supporting member and the substrate from the second substrate side; and
   means for supplying refrigerant to substantially the entire first substrate side to further cool the substrate,
   wherein the refrigerant is supplied perpendicularly to the first substrate side.

2. A cooling apparatus for cooling a substrate to be processed, comprising:
   a supporting member for supporting the substrate;
   cooling means for cooling said supporting member; and
   refrigerant supplying means for supplying a refrigerant to the substrate supported by said supporting member,
   wherein said supporting member has a holding member for holding a peripheral portion of the substrate in such a manner that the substrate floats from said supporting member.

3. A cooling apparatus for cooling a substrate to be processed, comprising:
   a supporting member for supporting the substrate;
   cooling means for cooling said supporting member; and
   refrigerant supplying means for supplying a refrigerant to the substrate supported by said supporting member,
   wherein said cooling means is a cooling device disposed in said supporting member.

4. The cooling apparatus as set forth in claim 3, wherein said cooling device is a Peltier device.

5. A cooling apparatus for cooling a substrate to be processed, comprising:
   a supporting member for supporting the substrate;
   cooling means for cooling said supporting member; and
   refrigerant supplying means for supplying a refrigerant to the substrate supported by said supporting member,
   wherein said cooling means is a cooling device disposed in said supporting member and a cooling water pipe that supplies cooling water.

6. The cooling apparatus as set forth in claim 5, wherein said cooling device is a Peltier device.

7. A cooling apparatus for cooling a substrate to be processed, the substrate having a first side and a second side opposite the first side, comprising:
   a supporting member for supporting the substrate on the second side;
   a removable cover that covers the supporting member and the substrate, the cover together with the supporting member providing a cooling chamber, the cover having a diffusion plate providing a plurality of paths for passage of refrigerant, the diffusion plate further dividing the cooling chamber into a first chamber and a second chamber, which is nearer to the substrate; and
   a refrigerant supplying system connected to the cover, the refrigerant supplying system supplying refrigerant to the first chamber,
   wherein the refrigerant passes through the paths in the diffusion plate to the second chamber, and thus to the first side of the substrate to cool the substrate supported by the supporting member.

8. The cooling apparatus according to claim 7, wherein the cover and the supporting member place the substrate in a sealed atmosphere, and wherein the cover has an upper portion where the first chamber is formed, a length across the first chamber being shorter than a length of the substrate, and has a lower portion where the second chamber is formed, a length across the second chamber being longer than the substrate length.

9. The cooling apparatus according to claim 7, further comprising means for controlling a supply amount of the refrigerant.

10. A cooling apparatus for cooling a substrate to be processed, comprising:
- a supporting member, having an upper and a lower surface, for supporting the substrate on the supporting member upper surface, and a plurality of through-holes extending between the supporting member upper and lower surfaces;
- a cover attached to the supporting member lower surface, the cover and the supporting member forming a chamber; and
- a refrigerant supplying means connected to the cover to supply refrigerant to the substrate through the through-holes in the supporting member.

11. The cooling apparatus according to claim 10, further comprising
- means for controlling the supply amount of the refrigerant.

12. A cooling apparatus for cooling a substrate to be processed, comprising:
- a supporting member for supporting the substrate;
- a cooling device disposed in said supporting member; and
- a cooling water pipe for circulating cooling water in said supporting member.

13. The cooling apparatus as set forth in claim 12,
- wherein said supporting member has a holding member for holding a peripheral portion of the substrate in such a manner that the substrate floats from said supporting member.

14. The cooling apparatus as set forth in claim 12,
- wherein said cooling device is a Peltier device.

15. The cooling apparatus as set forth in claim 13,
- wherein said cooling device and said cooling water pipe are disposed on the same plane.

16. A processing apparatus for supplying a liquid to a substrate to be processed and performing a predetermined process for the substrate, comprising:
- a heat processing portion for raising the temperature of the substrate; and
- a cooling portion for cooling the heated substrate,
- wherein said cooling portion comprises:
  - a supporting portion for supporting the substrate;
  - cooling means for cooling the supporting, the substrate having a first side and a second side opposite the first side, comprising:
    - a supporting member for supporting the substrate from the second substrate side;
    - cooling means for cooling said supporting member and the substrate from the second substrate side; and
    - means for supplying refrigerant to substantially the entire first substrate side to further cool the substrate,
      - wherein the refrigerant is supplied perpendicularly to the first substrate side.

17. A processing apparatus for supplying a liquid to a substrate to be processed and performing a predetermined process for the substrate, comprising:
- a heat processing portion for raising the temperature of the substrate and
- a cooling potion for cooling the heated substrate,
- wherein said cooling portion has:
  - a supporting the substrate;
  - a cooling device disposed in the supporting member; and
  - a cooling water pipe for circulating cooling water in the supporting member.

18. A cooling method for cooling a substrate to be processed, comprising the steps of:
- (a) quickly cooling the substrate at a first cooling velocity; and
- (b) cooling the substrate that was quickly cooled in the step (a) at a second cooling velocity that is slower than the first cooling velocity.

19. The cooling method as set forth in claim 18,
- wherein the step (a) is performed by directly contacting a refrigerant to the substrate so as to quickly cool the substrate, and
- wherein the step (b) is performed by cooling a supporting member that supports the substrate.

20. The cooling method as set forth in claim 19,
- wherein the supply amount of the refrigerant is controlled.

* * * * *